United States Patent
Liu et al.

(10) Patent No.: US 8,963,136 B2
(45) Date of Patent: Feb. 24, 2015

(54) OLED LIQUID CRYSTAL DISPLAY AND METHOD FOR LAMINATING ALIGNMENT FILM

(71) Applicant: Shenzhen China Star Optoelectronics Technology Co., Ltd., Shenzhen, Guangdong (CN)

(72) Inventors: Chih-Che Liu, Shenzhen (CN); Yuan-chun Wu, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 252 days.

(21) Appl. No.: 13/700,663

(22) PCT Filed: Nov. 8, 2012

(86) PCT No.: PCT/CN2012/084298
§ 371 (c)(1),
(2) Date: Nov. 28, 2012

(87) PCT Pub. No.: WO2014/071587
PCT Pub. Date: May 15, 2014

(65) Prior Publication Data
US 2014/0124743 A1    May 8, 2014

(30) Foreign Application Priority Data
Nov. 6, 2012 (CN) .......................... 2012 1 0438496

(51) Int. Cl.
H01L 29/08 (2006.01)
H01L 27/32 (2006.01)
(52) U.S. Cl.
CPC ..................................... *H01L 27/32* (2013.01)
USPC ............................................... 257/40; 438/27
(58) Field of Classification Search
CPC ..................................................... G02F 1/1337
USPC ............................................... 257/40; 438/27
See application file for complete search history.

(56) References Cited

U.S. PATENT DOCUMENTS

| | | | | |
|---|---|---|---|---|
| 6,831,725 | B2 * | 12/2004 | Niiya | 349/153 |
| 7,436,112 | B2 * | 10/2008 | Furukawa | 313/504 |
| 8,629,960 | B2 * | 1/2014 | Moriwaki | 349/122 |
| 2010/0314995 | A1 * | 12/2010 | Ikeda et al. | 313/504 |
| 2013/0248837 | A1 * | 9/2013 | Yokoyama | 257/40 |

* cited by examiner

Primary Examiner — Trung Q Dang
(74) Attorney, Agent, or Firm — Andrew C. Cheng

(57) ABSTRACT

The present invention relates to a method for laminating an alignment film onto an organic light emitting diode. The method includes a) deploying a bonding agent over a surface of the organic light emitting diode; b) laminating the alignment film with the organic light emitting diode on the surface deployed with bonding agent; and c) curing the bonding agent with heat or light such that the alignment film and the organic light emitting diode are completely laminated. The present invention further discloses an LED display device. By way of foregoing, during the lamination of the alignment film, bubbles can be avoided, and the yield can be increased.

8 Claims, 3 Drawing Sheets

OLED LIQUID CRYSTAL DISPLAY AND METHOD FOR LAMINATING ALIGNMENT FILM

The present invention relates to a technical filed of laminating an alignment film, and more particularly, to a technical field of OLED liquid crystal display, and a method for laminating, an alignment film therein.

In a display device made with n OLED (organic light-emitting diode), a thin layer of metallic material has to be deposed over an emitting surface through vacuum evaporation so as to configure a diode. However, this metallic layer will become reflective to the external light such that the overall contract of the display will be negatively affected. This reflective property wilt make the viewer difficult to clearly see the image, especially under the intensive light, or outdoors. Accordingly, the AMOLED (active-matrix organic light-emitting diode) display device with either top emission or bottom emission, an alignment film has to be applied so as to block the reflective light from external light source.

Currently, the alignment film is laminated by applying bonding agent over the alignment film firstly, and then attaching the alignment film over the OLED display device. However, small bubbles could be readily generated between the alignment film and the OLED display device. Specially, then the substrate is soft and flexible, the discrepancy of the flexibility between the substrate and the alignment film could easily harbor lots of bubbles. This will inevitably reduce the yield of the laminating of the alignment film.

SUMMARY OF THE INVENTION

It is an objective of the present invention to provide an OLED display device and a method for laminating an alignment film thereon. The laminating process is simplified so as to effectively avoid the generation of bubbles, while increases the yield of the lamination.

In order to resolve the issue encountered by the prior art, the present invention provides a technical solution by introducing as method for laminating an alignment film onto an OLED display device, wherein the OLED display device includes an organic light emitting diode configured with a substrate, an organic the emissive electroluminescent layer, and a packaging layer deployed over the emissive electroluminescent layer, wherein the method includes the steps of: a) deploying a bonding agent over a surface of the alignment film; b) laminating the alignment film with the organic light emitting diode; and c) curing the bonding agent with heat or light such that the alignment film and the organic light emitting, diode are completely laminated.

Wherein the bonding agent is a glue cured by an ultraviolet light, and the ultraviolet light is used to cure the glue.

Wherein the bonding agent is a glue cured by an infrared light, and the infrared light is used to cure the glue.

In order to resolve the issue encountered by the prior art, the present invention provides a technical solution by introducing a method for laminating an alignment film onto an OLED display device, wherein the OLED display device includes an organic light emitting diode configured with a substrate, an organic the emissive electroluminescent layer, and a packaging layer deployed over the emissive electroluminescent layer, wherein the method includes the steps of: a) deploying a bonding agent over a surface of the organic light emitting diode; b) laminating the alignment film with the organic light emitting diode on the surface deployed with bonding agent; and c) curing the bonding agent with heat or light such that the alignment film and the organic light emitting diode are completely laminated.

In order to resolve the issue encountered by the prior art, the present invention provides a technical solution by introducing an OLED display device, including an alignment film, a bonding agent layer, a packaging layer, an emissive electroluminescent layer, and a substrate.

Wherein the alignment film is configured with a cover protective layer, a first protective layer, an alignment base layer, a second protective layer, a glue layer, a delay layer, and a release layer stacked. together.

Wherein the bonding agent is a glue cured by an ultraviolet, light, and the ultraviolet light is used to cure the glue.

Wherein the OLED display device is an active matrix organic light emitting diode (AMOLED) display device.

Wherein the substrate is a flexible substrate.

By the provision of the present invention, the bonding agent is deployed over a surface of the alignment film, and then laminating the alignment film with the OLED display device. Further the bonding agent is further cured with heat or light so as to complete the lamination. Since the bonding agent is liquid state before it is cured and the relative relationship between the alignment film and the OLED display device can be readily adjusted in micro-scale. As a result, the bubbles can be easily avoided and the yield of the lamination is increased.

DETAILED DESCRIPTION OF PREFERRED EMBODIMENT

Detailed description in view of preferred embodiments will be given with the accompanied drawings.

Figure 1:
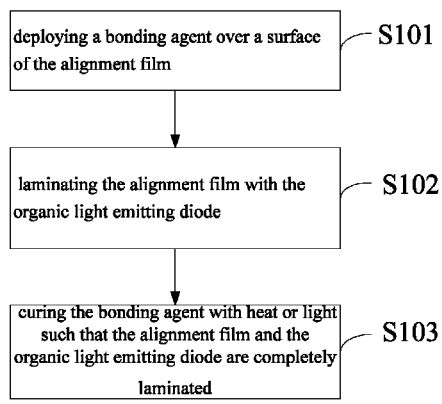
FIG. 1 is a flow diagram showing the method of laminating an alignment film over a surface of an OLED display device in accordance with the present invention.

Referring to FIG. 1, which is a flow diagram showing the method of laminating an alignment film over a surface of an OLED display device in accordance with the present invention. The organic light emitting diode includes, but should not be limited to merely the organic light emitting diode. The organic light emitting device generally includes a substrate, an organic emissive electroluminescent layer, and a packaging layer which covers the emissive electroluminescent layer. In the current embodiment, the substrate is a glass substrate or a flexible substrate.

Step S101: deploying a bonding agent over a surface of the alignment film.

In the current embodiment, the bonding agent is ultraviolet light cured glue or an infrared light cured glue. Of course, the bonding agent can also be a glue of activated with ultraviolet light. Other suitable bonding agent can also be applied as well. No lamination should be imposed herewith.

Step S102: laminating the alignment film with the organic light emitting diode.

Since during the beginning of the lamination, the bonding agent is in liquid state, and the relative relationship between the alignment film and the organic light emitting diode can be adjusted in micro-scale. The packaging layer can readily seal the organic light emitting diode so as to avoid the diode from contacting with the air which includes moisture and oxygen which are detrimental to the service life of the organic light emitting diode.

Step S103: curing the bonding agent with heat or light such that the alignment film and the organic light emitting diode are completely laminated.

Whether the bonding agent is cured with light or heat depending largely on what kind of bonding agent is used. If the bonding agent is an ultraviolet cured one, then the ultraviolet light is applied. If the bonding agent is an infrared cured one, then the infrared light is applied. It should be noted that when the a glue of afterward activated with ultraviolet light is applied, since the glue needs to be activated after exposed to the ultraviolet, accordingly, the glue has to be activated with the exposure of the ultraviolet light, and then laminated to the organic light emitting diode.

By the provision of the present invention, the bonding agent is deployed over a surface of the alignment film, and then laminating the alignment film with the OLED display device. Further the bonding agent is further cured with heat or light so as to complete the lamination. Since the bonding agent is liquid state before it is cured and the relative relationship between the alignment film and the OLED display device can be readily adjusted in micro-scale. As a result, the bubbles can be easily avoided and the yield of the lamination is increased.

Figure 2:
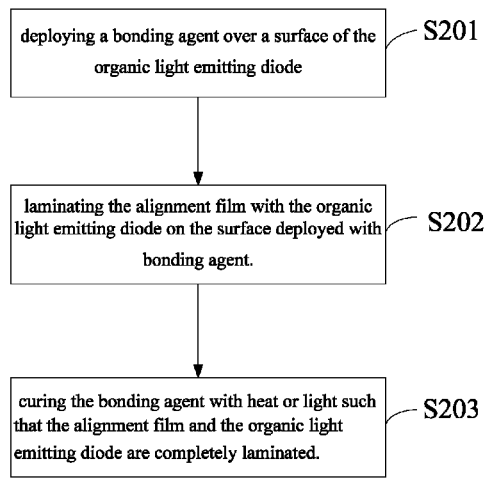
FIG. 2 is another flow diagram showing the method of laminating an alignment film over a surface of an OLED display device in accordance with the present invention.

Referring to FIG. 2, which is another flow diagram showing the method of laminating an alignment film over a surface of an OLED display device in accordance with the present invention. The organic light emitting diode includes, but should not be limited to merely the organic light emitting diode. The organic light emitting device generally includes a substrate, an organic emissive electroluminescent layer, and a packaging layer which covers the emissive electroluminescent layer. In the current embodiment, the substrate is a glass substrate or a flexible substrate.

Step 201: deploying a bonding agent over a surface of the organic light emitting diode.

In the current embodiment, the bonding agent is ultraviolet light cured glue or an infrared light cured glue. Of course, the bonding agent can also be a glue of activated with ultraviolet light. Other suitable bonding agent can also be applied as well. No lamination should be imposed herewith.

Step S202: laminating the alignment film with the organic light emitting diode on the surface deployed, with bonding agent; and Since during the beginning of the lamination, the bonding agent is in liquid state, and the relative relationship between the alignment film and the organic light emitting diode can be adjusted in micro-scale. The packaging layer can readily seal the organic light emitting diode so as to avoid the diode from contacting with the air which includes moisture and oxygen which are detrimental to the service life of the organic light emitting diode.

Step S203: curing the bonding agent with heat or light such that the alignment film and the organic light emitting diode are completely laminated.

Whether the bonding agent is cured with light or heat depending largely on what kind of bonding agent is used. If the bonding agent is an ultraviolet cured one, then the ultraviolet light is applied. If the bonding agent is an infrared cured one, then the infrared light is applied. It should be noted that when the a glue of afterward activated with ultraviolet light is applied, since the glue needs to be activated after exposed to the ultraviolet, accordingly, the glue has to be activated with the exposure of the ultraviolet light, and then laminated to the organic light emitting diode.

It should be noted that both the alignment film and the organic light emitting diode can be applied with bonding agent so as to achieve the same result. Accordingly, this application should be also protected by the scope of the present invention.

By the provision of the present invention, the bonding agent is deployed over a surface of the alignment film, and then laminating the alignment film with the OLED display device. Further the bonding agent is further cured with heat or light so as to complete the lamination. Since the bonding agent is liquid state before it is cured and the relative relationship between the alignment film and the OLED display device can be readily adjusted in micro-scale. As a result, the bubbles can be easily avoided and the yield of the lamination is increased.

Figure 3:
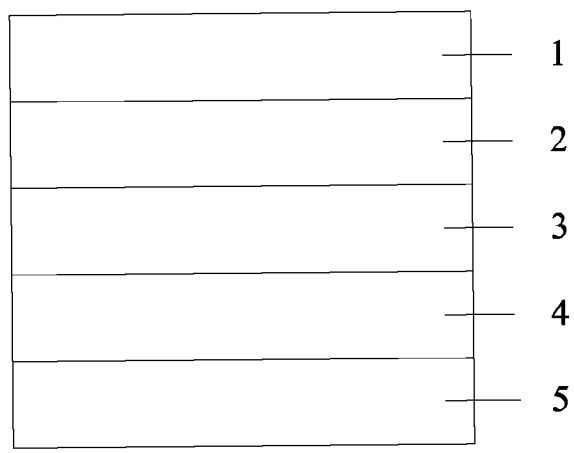
FIG. 3 is an illustrational and structural view showing an embodiment of the OLED display device with a bottom emission.

Referring to FIG. 3, which is an illustrational and structural view showing an embodiment of the OLED display device with a bottom emission.

In the present invention, the organic light emitting diode is preferable an active matrix organic light emitting diode, and which is configured with a packing film 1, an organic electroluminescent layer 2, a substrate 3, a bonding agent layer 4, and an alignment film 5. The packaging layer 1 seals the organic electroluminescent layer 2. Wherein the substrate 3 is a flexible substrate.

The bonding agent 4 is ultraviolet light cured glue or an infrared light cured glue, or the bonding agent activated with ultraviolet light. Other suitable bonding agent can also be applied as well. No lamination should be imposed herewith.

Figure 4:
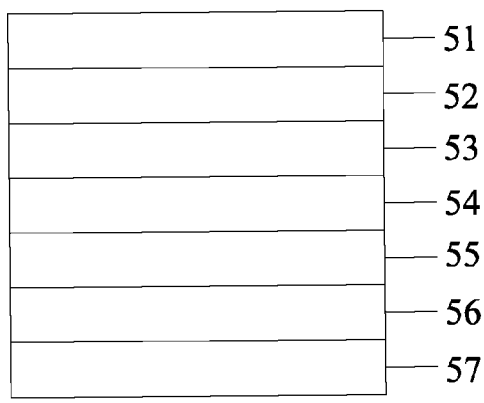
FIG. 4 is an illustrational and structural view of an alignment film of the OLED display device shown in FIG. 3.

Referring to FIG. 4, which is an illustrational and structural view of an alignment film of the OLED display device shown in FIG. 3. The alignment film 5 is configured with a cover protective layer 51, a first protective layer 52, an alignment base layer 53, a second protective layer 54, a glue layer 55, a delay layer 56, and a release layer 57 stacked together. In the present invention, the bonding agent layer 4 is used to laminate the alignment film 5, and the glue layer 55 located between the delay layer 56 and the release layer 57 can be therefore omitted.

Figure 5:
FIG. 5 is an illustrational and structural view showing an embodiment of the OLED display device with a bottom emission.

Referring to FIG. 5, which is an illustrational and structural view showing an embodiment of the OLED display device with a bottom emission.

In the present invention, the organic light emitting diode is preferable an active matrix organic light emitting diode, and which is configured with an alignment film 6, a bonding agent layer 7, a packaging layer 8, an organic electroluminescent layer 9 and a substrate 10. The packaging layer 8 seals the organic electroluminescent layer 9. Wherein the substrate 10 is a flexible substrate.

The bonding agent 7 is ultraviolet light cured glue or an infrared light cured glue, or the bonding agent activated with ultraviolet light. Other suitable bonding agent can also be applied as well. No lamination should be imposed herewith.

The alignment film 6 has a configuration identical to the alignment film 5 disclosed above. As a result, not detailed description is given.

By the provision of the present invention, the bonding agent is deployed over a surface of the alignment film, and then laminating the alignment film with the OLED display device. Since the bonding agent is liquid state before it is cured and the relative relationship between the alignment film and the OLED display device can be readily adjusted in micro-scale. As a result, the bubbles can be easily avoided and the yield of the lamination is increased. In addition, a film layer within the alignment film can be omitted and largely reduces the manufacturing cost.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related, fields of technique, is considered encompassed in the scope of protection defined by the clams of the present invention.

The invention claimed is:

1. A method for laminating an alignment film onto an OLED display device, wherein the OLED display device includes an organic light emitting diode configured with a substrate, an organic the emissive electroluminescent layer, and a packaging layer deployed over the emissive electroluminescent layer, wherein the method includes the steps of:
   a) deploying a bonding agent over a surface of the alignment film;
   b) laminating the alignment film with the organic light emitting diode; and
   c) curing the bonding agent with heat or light such that the alignment film and the organic light emitting diode are completely laminated.

2. The method as recited in claim 1, wherein the bonding agent is a glue cured by an ultraviolet light, and the ultraviolet light is used to cure the glue.

3. The method as recited in claim 1, wherein the bonding agent is a glue cured by an infrared light, and the infrared light is used to cure the glue.

4. A method for laminating an alignment film onto an OLED display device, wherein the OLED display device includes an organic light emitting diode configured with a substrate, an organic the emissive electroluminescent layer, and a packaging layer deployed over the emissive electroluminescent layer, wherein the method includes the steps of:
   a) deploying a bonding agent over a surface of the organic light emitting diode;
   b) laminating the alignment film with the organic light emitting diode on the surface deployed with bonding agent; and
   c) curing the bonding agent with heat or light such that the alignment film and the organic light emitting diode are completely laminated.

5. An OLED display device, including an alignment film, a bonding agent layer, a packaging layer, an emissive electroluminescent layer, and a substrate; and
   wherein the alignment film is configured with a cover protective layer, a first protective layer, an alignment base layer, a second protective layer, a glue layer, a delay layer, and a release layer stacked together.

6. The method as recited in claim 5, wherein the bonding agent is a glue cured by an ultraviolet light, and the ultraviolet light is used to cure the glue.

7. The OLED display device as recited in claim 5, wherein the OLED display device is an active matrix organic light emitting diode (AMOLED) display device.

8. The OLED display device as recited in claim 5, wherein the substrate is a flexible substrate.

* * * * *